(12) United States Patent
Funahashi et al.

(10) Patent No.: US 9,263,881 B2
(45) Date of Patent: Feb. 16, 2016

(54) DIGITAL AMPLITUDE MODULATION APPARATUS AND CONTROL METHOD OF DIGITAL AMPLITUDE MODULATION APPARATUS

(71) Applicant: Kabushiki Kaisha Toshiba, Minato-ku (JP)

(72) Inventors: Yuuki Funahashi, Tokyo (JP); Seiki Katayama, Tokyo (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/573,414

(22) Filed: Dec. 17, 2014

(65) Prior Publication Data

US 2015/0103954 A1   Apr. 16, 2015

Related U.S. Application Data

(63) Continuation of application No. PCT/JP2013/004124, filed on Jul. 3, 2013.

(30) Foreign Application Priority Data

Jul. 4, 2012   (JP) ................................. 2012-150310

(51) Int. Cl.
| | |
|---|---|
| H04K 1/02 | (2006.01) |
| H04L 25/03 | (2006.01) |
| H04L 25/49 | (2006.01) |
| H02H 9/04 | (2006.01) |
| H04B 1/04 | (2006.01) |
| H04L 27/04 | (2006.01) |

(52) U.S. Cl.
CPC . *H02H 9/04* (2013.01); *H04B 1/04* (2013.01); *H04B 1/0483* (2013.01); *H04L 27/04* (2013.01); *H04B 2001/0408* (2013.01)

(58) Field of Classification Search
CPC ........ H02H 9/04; H04L 27/04; H04B 1/0483; H04B 1/04; H04B 2001/0408
USPC .......................................................... 375/297
See application file for complete search history.

(56) References Cited

U.S. PATENT DOCUMENTS

| | | | |
|---|---|---|---|
| 2010/0197365 A1* | 8/2010 | Ripley et al. ................... | 455/572 |
| 2012/0205988 A1* | 8/2012 | Tanabe .......................... | 307/104 |
| 2013/0084851 A1* | 4/2013 | Li ................................. | 455/424 |
| 2013/0271342 A1* | 10/2013 | Shen ............................. | 343/861 |

\* cited by examiner

*Primary Examiner* — Tanmay Shah
(74) *Attorney, Agent, or Firm* — Oblon, McClelland, Maier & Neustadt, L.L.P.

(57) ABSTRACT

A digital amplitude modulation apparatus is provided with a measuring section, a fast surge protection section, a slow vector protection section, and a controller. The measuring section detects a voltage and a current from an RF signal. The fast surge protection section calculates an SWR from a detection signal of the measuring section, and obtains a first upper limit of the number of power amplifiers which can be put into an ON state based on the SWR and generates a first control signal. The slow vector protection section obtains a reflection coefficient from the output detection signal of the measuring section, and obtains a second upper limit of the number of the power amplifiers which can be put into an ON state based on the reflection coefficient and generates a second control signal. The controller controls the power amplifiers to be ON/OFF.

8 Claims, 6 Drawing Sheets

DIGITAL AMPLITUDE MODULATION APPARATUS AND CONTROL METHOD OF DIGITAL AMPLITUDE MODULATION APPARATUS

CROSS-REFERENCE TO RELATED APPLICATION

This application is based upon and claims the benefit of priority from the prior Japanese Patent Application No. 2012-150310, filed on Jul. 4, 2012, and the entire contents of which are incorporated herein by reference. This application is a continuation application of International Application No. PCT/JP2013/004124 filed on Jul. 3, 2013.

FIELD

Embodiments of the invention relate to a digital amplitude modulation apparatus which is used in a transmission apparatus of medium wave broadcasting and a control method of the digital amplitude modulation apparatus.

BACKGROUND

In medium wave broadcasting, for example, a digital amplitude modulation apparatus is used. The digital amplitude modulation apparatus has a plurality of power amplifiers arranged in parallel, controls the plurality of power amplifiers to be ON/OFF in accordance with a voltage amplitude level of a signal to be modulated, to thereby change the number of the power amplifiers which respectively output amplified carrier signals, and combines the respective output signals of the power amplifiers in an ON state, to thereby generate an amplitude modulation signal, and transmits an amplitude modulation signal wave to a prescribed broadcast service area.

In the above-described digital amplitude modulation apparatus, when the power amplifier breaks down, or some sort of fault occurs, there is a possibility that signal quality of an AM (Amplitude Modulation) wave deteriorates. For this reason, at lightning strike, or at the time of load system abnormalities such as disconnecting, failure, and surge mixing, for example, it is necessary to prevent breakdown of the power amplifier at the time of degradation of an SWR (Standing Wave Ratio) due to load characteristic of an antenna.

So, the digital amplitude modulation apparatus, in order to prevent breakdown of the power amplifier due to reflected power from an antenna and so on, for example, monitors the SWR, and controls the output power thereof based on the SWR.

Conventionally, when the SWR exceeds a warning limit, a method to turn off a switch of a transmission circuit, to thereby make the output power zero, and a method to reduce transmission power are known.

A general micro-computer is used for measurement of an SWR. Since a CPU of the micro-computer has a large arithmetic delay amount, the CPU of the micro-computer can not follow rapid change of the SWR due to lightning strike etc. in real time.

In addition, a determining method using an SWR calculated from a reflection coefficient that is a ratio of a reflected voltage to an incident voltage can not discriminate change of the output power due to a phase component of the reflection coefficient, and thereby narrows a broadcast service cover area more than necessary.

In addition, a protection circuit may malfunction due to degradation of the SWR by a modulation wave resulting from load characteristic of an antenna.

An object of the invention is to provide a digital amplitude modulation apparatus and a control method of a digital amplitude modulation apparatus which can perform protection operation of a power amplifier without narrowing a cover range of a broadcast service area and without deteriorating signal quality of an AM wave.

DETAILED DESCRIPTION

According to an embodiment, a digital amplitude modulation apparatus power-amplifies a transmission signal by a plurality of power amplifiers arranged in parallel, each of which is controlled to be ON/OFF in accordance with a voltage amplitude level of a signal to be modulated, combines outputs of the respective power amplifiers by a combiner, to generate an amplitude modulation signal as an RF (Radio Frequency) signal, and transmits an amplitude modulation wave to a prescribed broadcast service area.

The digital amplitude modulation apparatus is provided with a measuring section, a fast surge protection section, a slow vector protection section, and a controller. The measuring section detects a voltage and a current from the amplitude modulation signal. The fast surge protection section calculates an SWR using a detection signal outputted from the measuring section, compares the relevant SWR with a predetermined threshold value, and obtains a first upper limit of the number of the power amplifiers which can be put into an ON state and generates a first control signal including the first upper limit when the relevant SWR is larger than the threshold value. The slow vector protection section is connected in parallel with the fast surge protection section, calculates a reflection coefficient using the detection signal outputted from the measuring section, obtains an SWR from the relevant reflection coefficient, compares the SWR obtained from the reflection coefficient with the threshold value, and obtains a second upper of the limit number of the power amplifiers which can be put into an ON state and generates a second control signal including the second upper limit when the relevant SWR is not more than the threshold value. The controller controls the power amplifiers to be ON/OFF in accordance with the voltage amplitude level of the signal to be modulated within the first upper limit upon receiving the first control signal, and controls the power amplifiers to be ON/OFF in accordance with the voltage amplitude level of the signal to be modulated within the second upper limit upon receiving the second control signal.

Hereinafter, embodiments will be described with reference to the drawings.

EMBODIMENTS

First Embodiment

In the first embodiment, all power amplifiers are controlled such that they can be put into an ON state during normal operation.

Figure 1:
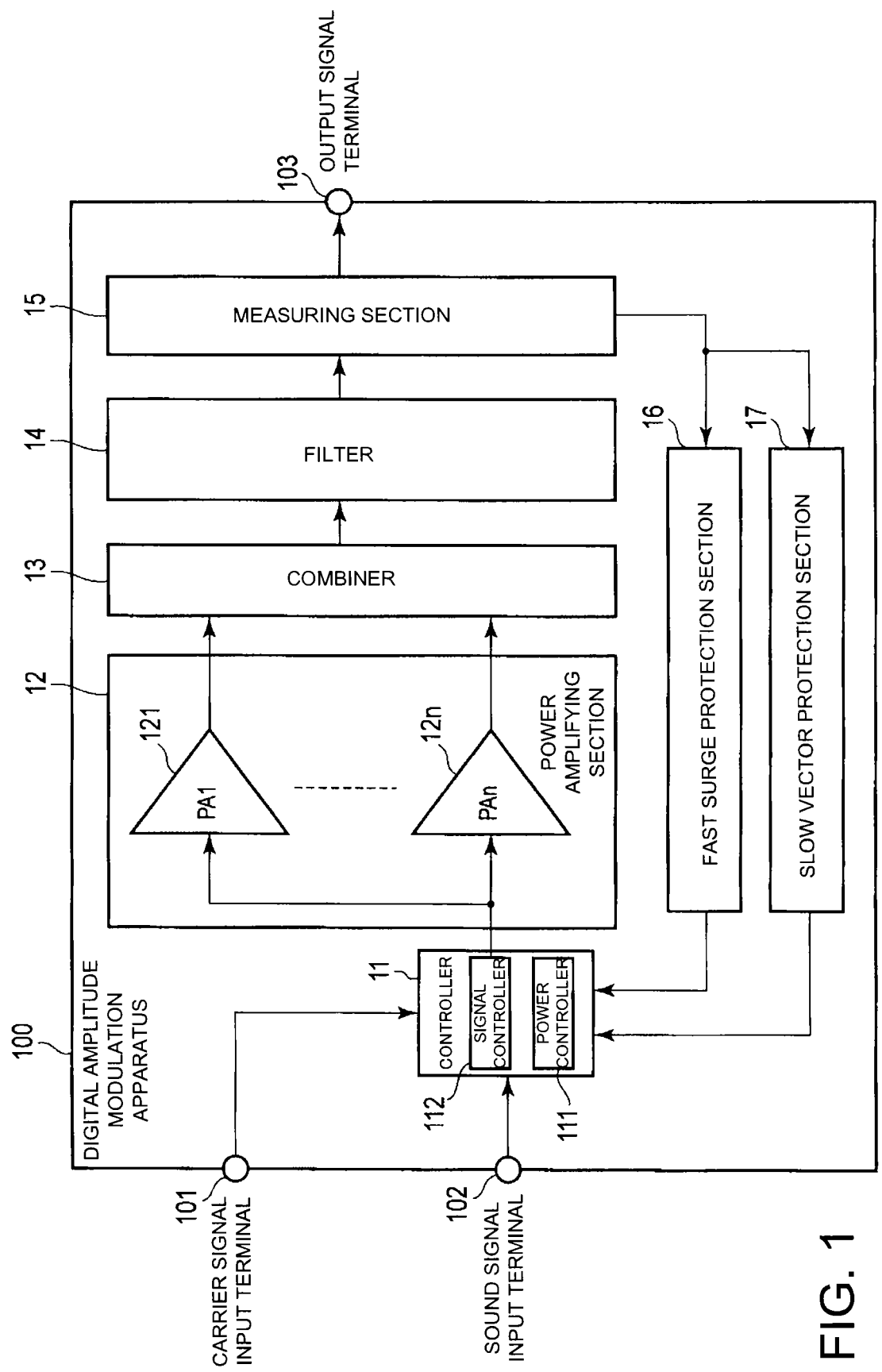
FIG. 1 is a block diagram showing a configuration of a digital amplitude modulation apparatus in a first embodiment.

FIG. 1 is a block diagram showing a configuration of a digital amplitude modulation apparatus in the first embodiment.

A digital amplitude modulation apparatus 100 shown in FIG. 1 has a carrier signal input terminal 101, a sound signal input terminal 102, an output signal terminal 103, a controller 11, a power amplifying section 12, a combiner 13, a filter 14, a measuring section 15, a fast surge protection section 16 and a slow vector protection section 17.

A carrier signal, that is, a transmission signal is inputted to the carrier signal input terminal 101. The carrier signal inputted to the carrier signal input terminal 101 is inputted to the controller 11, and is distributed and supplied to n (n is an arbitrary natural number) power amplifiers 121-12n of the power amplifying section 12 through the controller 11.

A sound signal, that is, a signal to be modulated is inputted to the sound signal input terminal 102. The inputted sound signal is inputted to the controller 11.

The power amplifying section 12 includes the plurality of power amplifiers 121-12n. Each of the power amplifiers 121-12n becomes in an ON state (a drive state) or in an OFF state (a stop state) in accordance with an ON/OFF control signal or a phase difference of the carrier signals, and the power amplifiers 121-12n which are in the ON state amplify the carrier signal. The power amplifying section 12 outputs the carrier signals amplified by the power amplifiers 121-12n which are in the ON state.

The combiner 13 combines the amplified carrier signals which the power amplifiers 121-12n in the ON state output, to generated an amplitude modulation signal (an AM signal).

The filter 14 removes an unnecessary frequency component from the AM signal outputted from the combiner 13. The AM signal outputted from the filter 14 passes through the measuring section 15, and is transmitted, as an amplitude-modulated broadcast wave (an AM wave) of the RF band, from a transmission antenna not shown toward a prescribed area through the output signal terminal 103. Generally, a transmission antenna is connected to a front of the output signal terminal 103. A matching circuit, a filter and a rejector may be interposed between the output signal terminal 103 and the transmission antenna.

The order of the combiner 13, the filter 14 and the measuring section 15 may be an order other than the order shown in FIG. 1. In addition, even if the combiner 13 and the filter 14 are deleted from the digital amplitude modulation apparatus 100, there will be essentially no problem if a circuit to realize a function equivalent to those functions is present between the output signal terminal 103 and the antenna.

Figure 2:
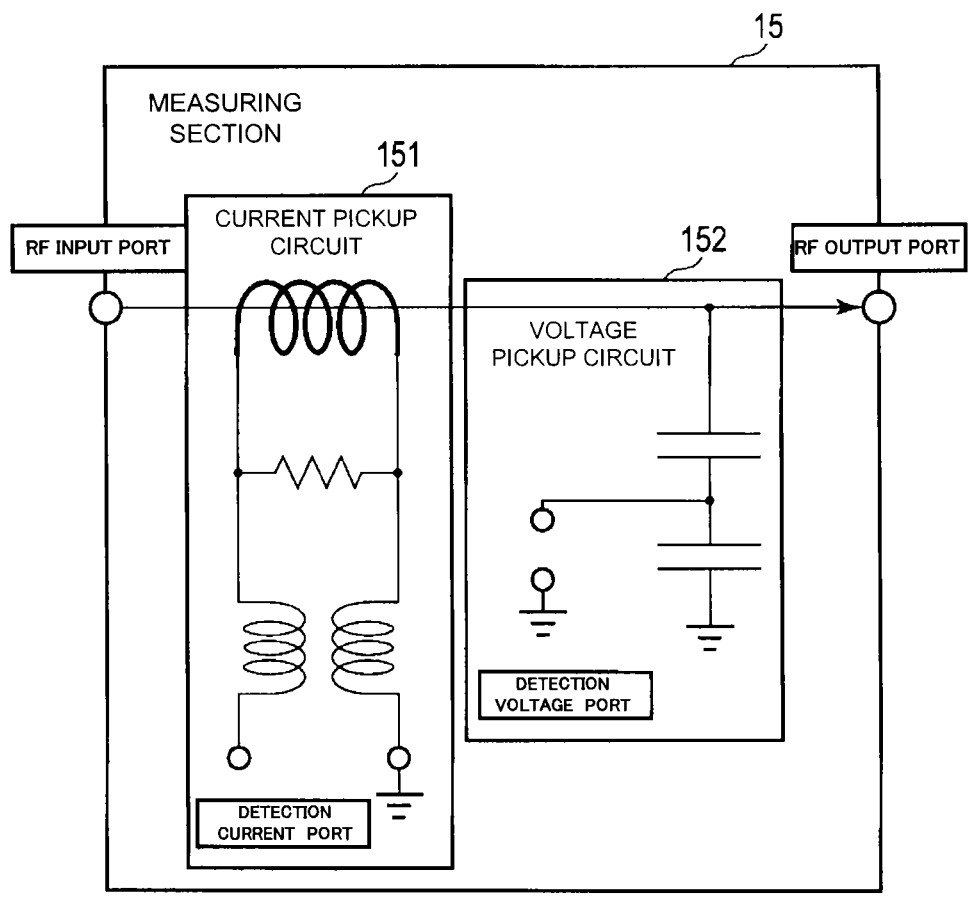
FIG. 2 is a diagram showing a circuit configuration of a measuring section shown in FIG. 1.

As shown in FIG. 2, the measuring section 15 is provided with a current pickup circuit 151 and a voltage pickup circuit 152. The current pickup circuit 151 picks up a current of the AM signal flowing through the measuring section. The voltage pickup circuit 152 picks up a voltage of the AM signal. The measuring section 15 supplies the picked up detection current and detection voltage as a detection signal to the fast surge protection section 16 and the slow vector protection section 17.

In the embodiment, the measuring section 15 detects the voltage and the current having the same amplitude. But, the measuring section 15 may detect a voltage v1 and a voltage v2 at a position distant from the detecting position of the voltage v1 by $\lambda/4$ in the electric length. That is, the measuring section may detect two signals which are same in amplitude and are different in phase by $\pi/2$.

The fast surge protection section 16 is composed of an analog circuit. The fast surge protection circuit 16 calculates an SWR using the detection signal, that is, the detection current and the detection voltage which are picked up by the measuring section 15, and compares the calculated SWR with a predetermined threshold value. When the SWR is larger than the threshold value, the fast surge protection section 16 obtains an upper limit of the number of the power amplifiers 121-12n (hereinafter, referred to as an upper limit of the number of PAs) which can be put into an ON state based on the SWR, and outputs an output control signal including the upper limit of the number of PAs to the controller 11.

The slow vector protection section 17 is composed of a digital circuit. The slow vector protection circuit 17 calculates a reflection coefficient using the detection signal, that is, the detection current and the detection voltage which are picked up by the measuring section 15, and compares an SWR obtained from the calculated reflection coefficient with a threshold value. When the SWR is not more than the threshold value, the slow vector protection circuit 17 obtains an upper limit of the number of PAs indicating an upper limit of the number of the power amplifiers 121-12n which can be put into an ON state, based on the reflection coefficient, and outputs an output control signal including the upper limit of the number of PAs to the controller 11.

The carrier signal from the carrier signal input terminal 101, the sound signal from the sound signal input terminal 102, the output control signal from the fast surge protection section 16, and the output control signal from the slow vector protection section 17 are inputted to the controller 11. The controller 11 generates a control signal which controls the power amplifier to be ON/OFF in accordance with a voltage amplitude level of the sound signal, or generates a control signal which controls a phase of the carrier signal in order to control the power amplifier to be ON/OFF. The controller 11 is provided with a power controller 111, and a signal controller 112.

Upon receiving the output control signal from the fast surge protection section 16, the controller 11 controls the power amplifiers to be ON/OFF in accordance with the voltage amplitude level of the sound signal within the upper limit of the number of PAs included in the output control signal. In addition, upon receiving the output control signal from the slow vector protection section 17, the controller 11 controls the power amplifiers to be ON/OFF in accordance with the voltage amplitude level of the sound signal within the upper limit of the number of PAs included in the output control signal.

The voltage amplitude level of the sound signal inputted to the sound signal input terminal 102, the output control signal from the fast surge protection section 16 and the output control signal from the slow vector protection section 17 are inputted to the power controller 111. The power controller 111 calculates the number of the power amplifiers (the number of ON PAs) which are put into the ON state, in accordance with the voltage amplitude level of the sound signal and the upper limit of the number of PAs, and controls the signal controller 112 based on the number of ON PAs.

The signal controller 112 generates an ON/OFF control signal or a phase difference of the carrier signals, based on the number of ON PAs calculated by the power controller 111, and performs ON/OFF control of the power amplifiers by the ON/OFF control signal or the phase difference of the carrier signals.

Figure 3:
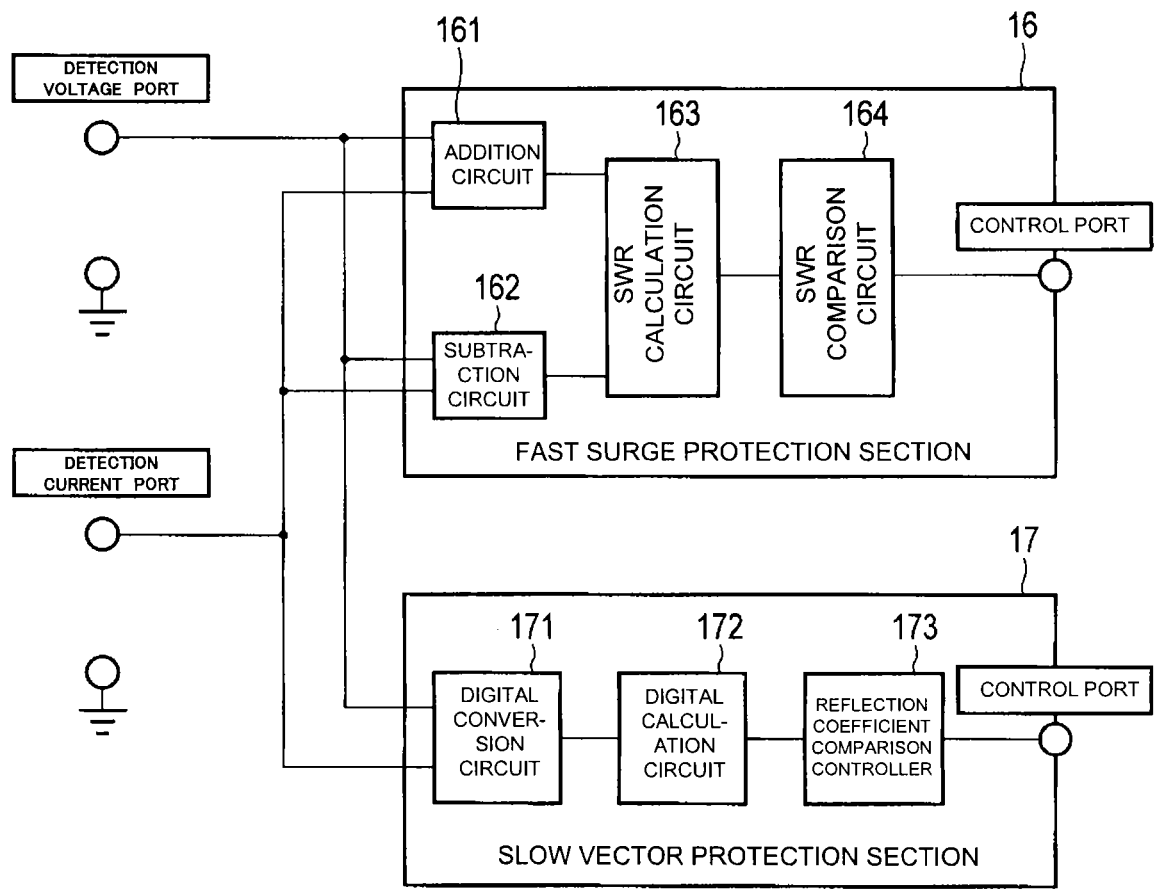
FIG. 3 is a block diagram showing a specific configuration of a fast surge protection section and a slow vector protection section shown in FIG. 1.

FIG. 3 is a block diagram showing a specific configuration of the fast surge protection section 16 and the slow vector protection section 17.

The fast surge protection section 16 is provided with an addition circuit 161, a subtraction circuit 162, an SWR calculation circuit 163, and an SWR comparison controller 164.

The addition circuit 161 adds the detection current and the detection voltage that are the detection signal supplied from the measuring section 15, to obtain an incident voltage.

The subtraction circuit 162 subtracts the detection current and the detection voltage that are the detection signal supplied from the measuring section 15, to obtain a reflected voltage.

The SWR calculation circuit 163 calculates the SWR from a magnitude Γ (gamma) of a reflection coefficient ρ that is a quotient of the reflected voltage divided by the incident voltage.

The SWR comparison controller 164 compares the SWR calculated by the SWR calculation circuit 163 with a predetermined threshold value. If the SWR is larger than the threshold value, the SWR comparison controller 164 generates the output control signal indicating that the upper limit of the number of PAs is 0, and outputs the output control signal to the controller 11. The fast surge protection section 16 may perform output power control utilizing the reflected voltage in place of the SWR.

The fast surge protection section 16 is a means for rapidly performing output control when relatively large reflected voltage is generated, to cause the bearing force of the power amplifier to become small, and protects the power amplifier.

On the other hand, the slow vector protection section 17 is provided with a digital conversion circuit 171, a vector calculation circuit 172, and a reflection coefficient comparison controller 173.

The digital conversion circuit 171 performs analog-to-digital conversion of the detection current and the detection voltage that are the detection signal supplied from the measuring section 15.

The vector calculation circuit 172 calculates a reflection coefficient ρ which is averaged in the time domain from the digital data obtained by the digital conversion circuit 171.

The reflection coefficient comparison controller 173 obtains an SWR from the reflection coefficient ρ obtained by the vector calculation circuit 172, and compares the SWR with the threshold value set in the fast surge protection section 16. When the SWR is not more than the threshold value, the reflection coefficient comparison controller 173 generates the output control signal indicating that the upper limit of the number of PAs is m (m is an arbitrary natural number not more than n) in accordance with the value of the reflection coefficient ρ, and outputs the output control signal to the controller 11.

In addition, the fast surge protection section 16 may perform the output power control using the reflected voltage. In this case, the reflection coefficient comparison controller 173 compares the reflected voltage obtained from the reflection coefficient ρ which is obtained by the vector calculation circuit 172 with the threshold value for the reflected voltage which is set in the fast surge protection section 16. When the reflected voltage is not more than the threshold value, the reflection coefficient comparison controller 173 generates the output control signal indicating that the upper limit of the number of PAs is m (m is an arbitrary natural number not more than n) in accordance with the value of the reflection coefficient ρ.

That is, when the reflected voltage or the sum of the incident voltage and the reflected voltage is relatively small, to cause the bearing force of the power amplifier to become large, the slow vector protection section 17 protects the power amplifier while performing the output power control.

Next, an operation in the above-described configuration will be described.

The fast surge protection section 16 rapidly performs the output control when a relatively large reflected voltage is generated, to protect the power amplifier.

The fast surge protection section 16 calculates an incident voltage Vf and a reflected voltage Vr using a detection current i and a detection voltage v1 which are detected by the measuring section 15.

The addition circuit 161 converts the detection current i into a voltage v2 which is different in phase from the detection voltage v1 by $\pi/2$, and calculates an absolute value of the incident voltage Vf using the detection voltage v1 and the voltage v2.

$$|Vf|=|v1+v2|$$

The subtraction circuit 162 converts the detection current i into the voltage v2 which is different in phase from the detection voltage v1 by $\pi/2$, and calculates an absolute value of the reflected voltage Vr using the detection voltage v1 and the voltage v2.

$$|Vr|=|v1-v2|$$

The SWR calculation circuit 163 calculates the SWR from the absolute value |Vf| of the incident voltage and the absolute value |Vr| of the reflected voltage. The SWR is calculated by the following expression.

$$SWR=(1+|Vr|/|Vf|)/(1-|Vr|/|Vf|)$$

The SWR comparison controller 164 compares the SWR calculated by the SWR calculation circuit 163 with a certain threshold value. When the SWR calculated by the SWR calculation circuit 163 is larger than the certain threshold value, the SWR comparison controller 164 generates the output control signal in which the upper limit of the number of PAs is 0, that is, which puts the whole power amplifiers into an OFF state. This is an output control signal to perform processing for preventing breakdown of the power amplifier when the load ends are short-circuited or opened by some reason such as thunder, particularly at the time of short-circuit.

As described above, the measuring section 15 can realize the same processing by detecting, except the detection current i, the voltage v1 and the voltage v2 at a position distant from the detecting position of the voltage v1 by $\lambda/4$ in the electric length.

In addition, the SWR comparison controller 164 may use the absolute value |Vr| of the reflected voltage, instead of using the SWR. In this case, the SWR comparison controller 164 compares the absolute value |Vr| of the reflected voltage with a certain threshold value, and when the absolute value |Vr| of the reflected voltage is larger than the certain threshold value, the SWR comparison controller 164 generates the output control signal in which the upper limit of the number of PAs is 0, that is, which puts the whole power amplifiers into an OFF state.

When the reflected voltage or the sum of the incident voltage and the reflected voltage is relatively small, the slow vector protection section 17 sets the upper limit of the number of PAs to a prescribed number. By this means, while performing output power control so as not to narrow a broadcast service cover area range more than necessary, the slow vector protection section 17 protects the power amplifier.

The digital conversion circuit 171 performs analog-to-digital conversion of the detection current i and the detection voltage v1 which are detected by the measuring section 15.

The vector calculation circuit 172 performs digital processing of the digitally converted detection current i and detection voltage v1, to obtain the reflection coefficient ρ that is a vector value which is averaged in the time domain. The vector calculation circuit 172 performs digital processing of the detection voltage v1 and the detection current i, or the voltage v2 which is converted from the detection current i and is different in phase from the detection voltage v1 by π/2, to calculate the reflection coefficient ρ=Vr/Vf.

The reflection coefficient comparison controller 173 obtains the SWR from the reflection coefficient ρ, and compares the SWR with the threshold value set in the fast surge protection section 16. When the SWR is not more than the threshold value, the reflection coefficient comparison controller 173 generates the output control signal indicating that the upper limit of the number of PAs is a prescribed number, based on the reflection coefficient ρ.

Figure 4:
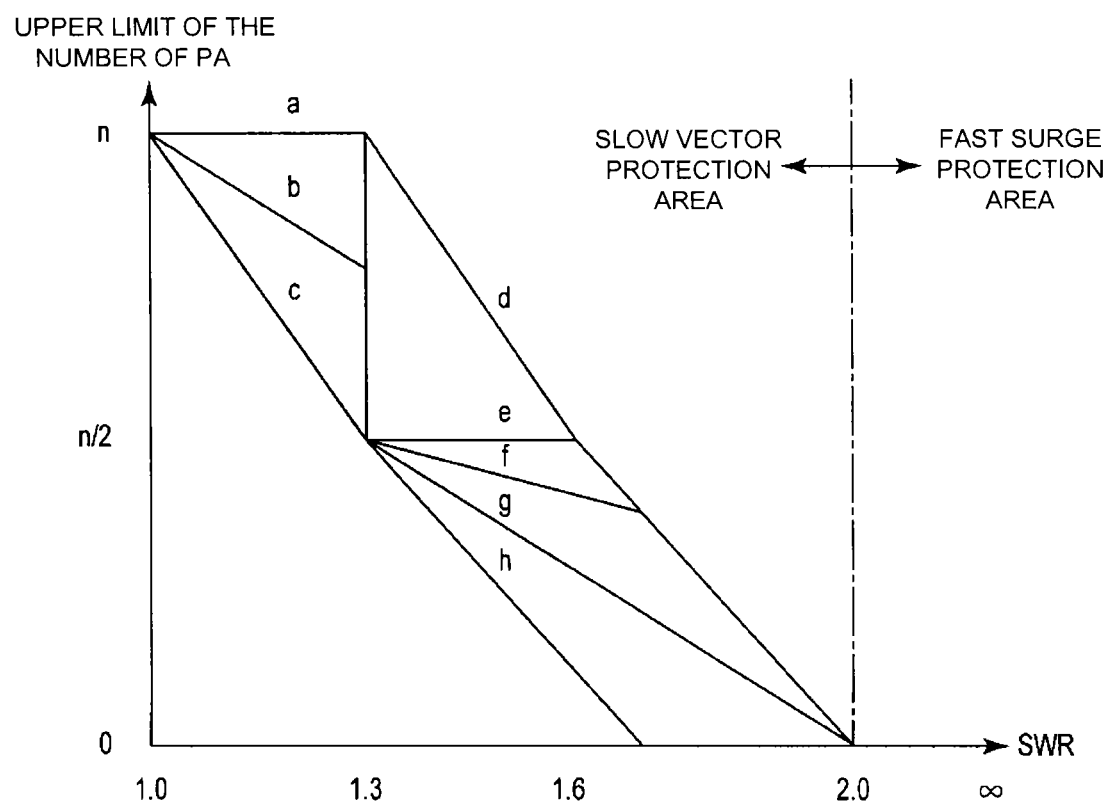
FIG. 4 is a diagram showing the relation between control areas of the fast surge protection section and the slow vector protection section in the first embodiment.

FIG. 4 shows the relation between a control area of the fast surge protection section 16 and a control area of the slow vector protection section 17. In FIG. 4, the threshold value=SWR 2.0 divides the fast surge protection area from the slow vector protection area. By this means, the processing based on the output control signal of the fast surge protection section 16 can prevent breakdown of the power amplifier by the calculation delay and the delay due to averaging processing of the slow vector protection section 17 resulting from the digital processing. That is, when the SWR that is a scalar value and is calculated by the fast surge protection section 16 is larger than the threshold value 2.0, the upper limit of the number of PAs is made 0, and furthermore when the SWR obtained from the reflection coefficient that is a vector value calculated by the slow vector protection section 17 is larger than the threshold value 2.0, priority is given to the processing based on the output control signal of the fast surge protection section 16, and the upper limit of the number of PAs is made 0.

On the other hand, when the SWR obtained from the reflection coefficient that is the vector value and is calculated by the slow vector protection section 17 is smaller than the threshold value 2.0, the apparatus is controlled as follows.

When the SWR is 1.0-1.3, the upper limit of the number of PAs is changed as a, for example, based on the phase relation between the incident voltage Vf and the reflected voltage Vr, that is, the reflection coefficient ρ. In this case, the upper limit becomes n. This is based on the thinking that when the reflected voltage or the sum of the incident voltage and the reflected voltage is relatively small, the bearing force of the power amplifier is sufficient. According to this, the effect to prevent more output power control than necessary is obtained.

In addition, when the SWR obtained from the reflection coefficient calculated by the slow vector protection section 17 is 1.3-1.6, the upper limit of the number of PAs is changed to n−n/2 as d, for example.

In addition, when the output power control is performed based on the reflected voltage in place of the SWR, the output power control is performed based on the same thinking as in the SWR.

As described above, in the first embodiment, the fast surge protection section 16 and the slow vector protection section 17 as the protection circuit are connected in parallel, in order to prevent malfunction.

When the reflected voltage is relatively large, the number of the power amplifiers 121-12n (the upper limit of the number of PAs) which can be put into the ON state is obtained, using the fast surge protection section 16 capable of following in real time. In addition, when the reflected voltage is relatively large, the power amplifiers 121-12n have small margin in the bearing forces.

On the other hand, when the reflected voltage or the sum of the incident voltage and the reflected voltage is relatively small, the number of the power amplifiers 121-12n (the upper limit of the number of PAs) which can be put into the ON state is obtained, using the slow vector protection section 17 which performs the output control using the vector value. In addition, when the reflected voltage or the sum of the incident voltage and the reflected voltage is relatively small, the power amplifiers have sufficient margin in the bearing forces.

Accordingly, the first embodiment can perform optimum protection operation of the power amplifiers 121-12n. The first embodiment can rapidly protect the power amplifiers 121-12n at lightning strike. In addition, when the reflected voltage or the sum of the incident voltage and the reflected voltage is relatively small, while performing output power control so as not to narrow a broadcast service cover area range, the first embodiment can protect the power amplifiers 121-12n. In addition, the first embodiment can prevent malfunction of the protection circuit due to deterioration of the SWR by the modulation wave resulting from load characteristic of an antenna.

In addition, the first embodiment makes the upper limit of the number of PAs calculated by the fast surge protection section 160, and rapidly makes the whole power amplifiers 121-12n OFF, and thereby can protect the whole power amplifiers 121-12n against the rapid change of the SWR due to lightning strike and so on.

In addition, in the first embodiment, when the SWR obtained from the reflection coefficient calculated by the slow vector protection section 17 is larger than the threshold value, priority is given to the processing based on the output control signal of the fast surge protection section 16. By this means, breakdown of the power amplifier by the calculation delay and the delay due to averaging processing of the slow vector protection section 17 resulting from the digital processing can be prevented by the processing based on the output control signal of the fast surge protection section 16.

Second Embodiment

A second embodiment realizes the processing of the fast surge protection section and the processing of the slow vector protection section by a processor and a program of a controller.

Figure 5:
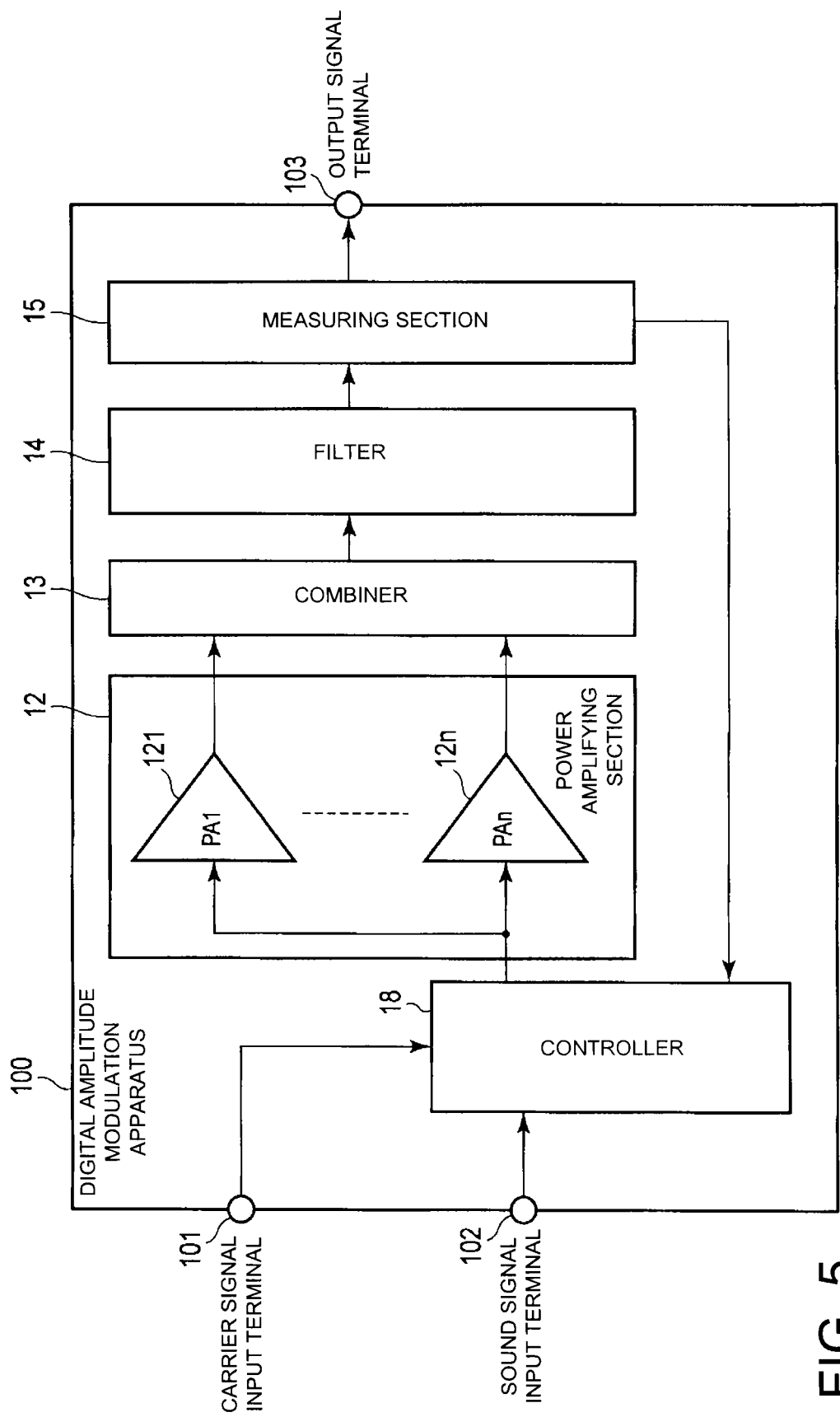
FIG. 5 is a block diagram showing a configuration of a digital amplitude modulation apparatus in a second embodiment.

FIG. 5 is a block diagram showing a configuration of a digital amplitude modulation apparatus in the second embodiment. In addition, in FIG. 5, the same symbols as the symbols described in FIG. 1 are given to the same portions as the portions described in FIG. 1, and the duplicated description will be omitted.

The AM signal generated by the combiner 13 is supplied to the measuring section 15 through the filter 14. The measuring section 15 picks up the current of the AM signal flowing through the measuring section 15 using the current pickup circuit 151, and picks up the voltage of the AM signal using the voltage pickup circuit 152. And, the measuring section 15 supplies the picked up detection current and detection voltage to a controller 18 as the detection signal.

Figure 6:
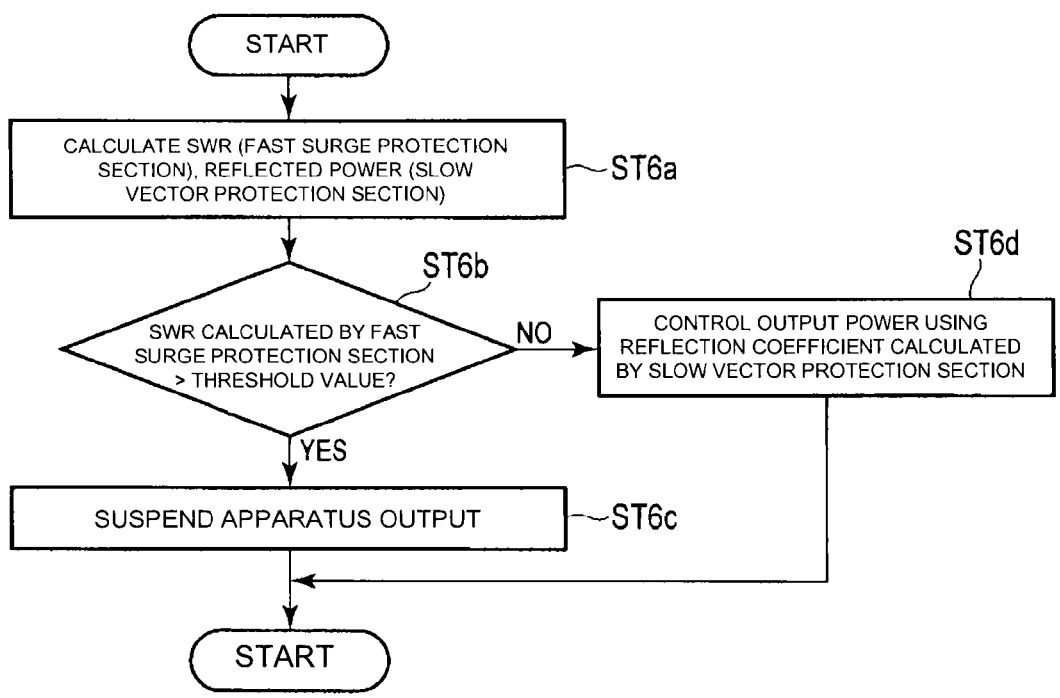
FIG. 6 is a flow chart showing a control processing procedure of a controller in the second embodiment.

FIG. 6 is a flow chart showing a control processing procedure of the above-described controller 18.

The controller 18 calculates the SWR in the fast surge protection section using the detection current and the detection voltage picked up by the measuring section 15, and calculates the reflection coefficient using the detection current and the detection voltage, and calculates a reflected power from the reflection coefficient in the slow vector protection section (step ST6a). The controller 18 compares the SWR with a predetermined threshold value, and judges whether or not the SWR is larger than the threshold value (step ST6b).

Here, when the SWR is larger than the threshold value (Yes), the controller 18 makes the upper limit of the number of PAs "0", and controls the whole power amplifiers 121-12n to the OFF state (step ST6c).

On the other hand, when the SWR is not more than the threshold value (No), the controller 18 obtains the upper limit of the number of PAs based on the reflection coefficient calculated in the slow vector protection section, and controls the power amplifiers 121-12n to be ON/OFF in accordance with the voltage amplitude level of the sound signal within the upper limit of the number of PAs (step ST6d).

As described above, even in the second embodiment, the same operation and effect can be obtained as in the first embodiment.

Third Embodiment

In a third embodiment, the apparatus is controlled so that a part of the power amplifiers out of the whole power amplifiers can be put into an ON state during normal operation.

Here, the apparatus is controlled so that only eight power amplifiers 121-128 out of the power amplifiers 121-12n shown in FIG. 1 can be put into the ON state.

Next, an operation in the above-described configuration will be described.

The fast surge protection section 16 calculates the incident voltage Vf and the reflected voltage Vr of the AM signal based on the power amplifiers 121-128 which can be put into the ON state during normal operation. That is, the fast surge protection section 16 calculates, using the detection voltage v1, and the voltage v2 which is converted from the detection current i and is different in phase from the detection voltage v1 by $\pi/2$, the absolute value |Vf| of the incident voltage and the absolute value |Vr| of the reflected voltage. |Vf|=|v1+v2|, and |Vr|=|v1−v2|. And when the absolute value |Vr| of the reflective voltage is not less than the certain threshold value, or the SWR (=(1+|Vr|/|Vf|)/(1−|Vr|/|Vf|)) that is the scalar value and is calculated using the SWR calculation circuit 163 is larger than the certain threshold value, the SWR comparison controller 164 generates the output control signal indicating that the upper limit of the number of PAs is 0, that is the output control signal to put the whole power amplifiers into the OFF state. This is the output control signal to perform processing for preventing breakdown of the power amplifier when the load ends are short-circuited or opened by some reason such as thunder, particularly at the time of short-circuit.

As described above, the measuring section 15 can realize the same processing by detecting, except the detection current i, the voltage v1 and the voltage v2 at a position distant from the detecting position of the voltage v1 by $\lambda/4$ in the electric length.

The slow vector protection section 17 performs digital processing of the detection current i and the detection voltage v1 which are detected by the measuring section 15, to obtain the reflection coefficient $\rho$ that is the vector value and is averaged in the time domain. The reflection coefficient $\rho$=Vr/Vf is calculated by the digital processing of the detection voltage v1 and the detection current i or the voltage v2 which is converted from the detection current i and is different in phase from the detection voltage v1 by $\pi/2$. The SWR obtained from the reflection coefficient $\rho$ is compared with the threshold value set in the fast surge protection section 16. When the SWR is not more than the threshold value, the slow vector protection section 17 determines the upper limit of the number of PAs based on the reflection coefficient $\rho$, and generates the output control signal including the upper limit of the number of PAs.

When the SWR that is the scalar value and is calculated by the fast surge protection section 16 is larger than the threshold value 2.0, the controller 11 makes the upper limit of the number of PAs 0, and furthermore when the SWR obtained from the reflection coefficient that is the vector value and is calculated by the slow vector protection section 17 is larger than the threshold value 2.0, the controller 11 gives priority to the processing based on the output control signal of the fast surge protection section 16, and makes the upper limit of the number of PAs 0.

On the other hand, when the SWR obtained from the reflection coefficient that is the vector value and is calculated by the slow vector protection section 17 is smaller than the threshold value 2.0, the apparatus is controlled as follows.

When the SWR obtained from the reflection coefficient is 1.0-1.3, the controller 11 controls the power amplifiers 121-128 so that they can be put into the ON state, based on the phase relation between the incident voltage Vf and the reflected voltage Vr, that is, the reflection coefficient $\rho$, and controls the power amplifiers 129-12n that are in the OFF state during normal operation so that they can be put into the ON state. That is, the controller 11 controls the upper limit of the number of PAs to "n".

When the SWR obtained from the reflection coefficient is 1.3-1.6, the controller 11 keeps the state in which the power amplifiers 121-128 can be put into the ON state, based on the phase relation between the incident voltage Vf and the reflected voltage Vr, that is, the reflection coefficient $\rho$.

In addition, when the SWR obtained from the reflection coefficient calculated by the slow vector protection section 17 is 1.6-1.8, the controller 11 controls the power amplifiers 126-128 so that they can not be put into the ON state, out of the power amplifiers 121-128 which can be put into the ON state, based on the phase relation between the incident voltage Vf and the reflected voltage Vr, that is, the reflection coefficient $\rho$, that is, the controller 11 controls the upper limit of the number of PAs to "5".

As described above, even in the above-described third embodiment, the same operation and effect can be obtained as in the above-described first embodiment. In particular, the output of the digital amplitude modulation apparatus can be decreased or increased in accordance with the reflection coefficient calculated by the slow vector protection section 17, and thereby the digital amplitude modulation apparatus can flexibly cope with changes.

Fourth Embodiment

In a fourth embodiment, the upper limit of the number of PAs calculated by the fast surge protection section 16 is not 0, but 1 or 2.

Figure 7:
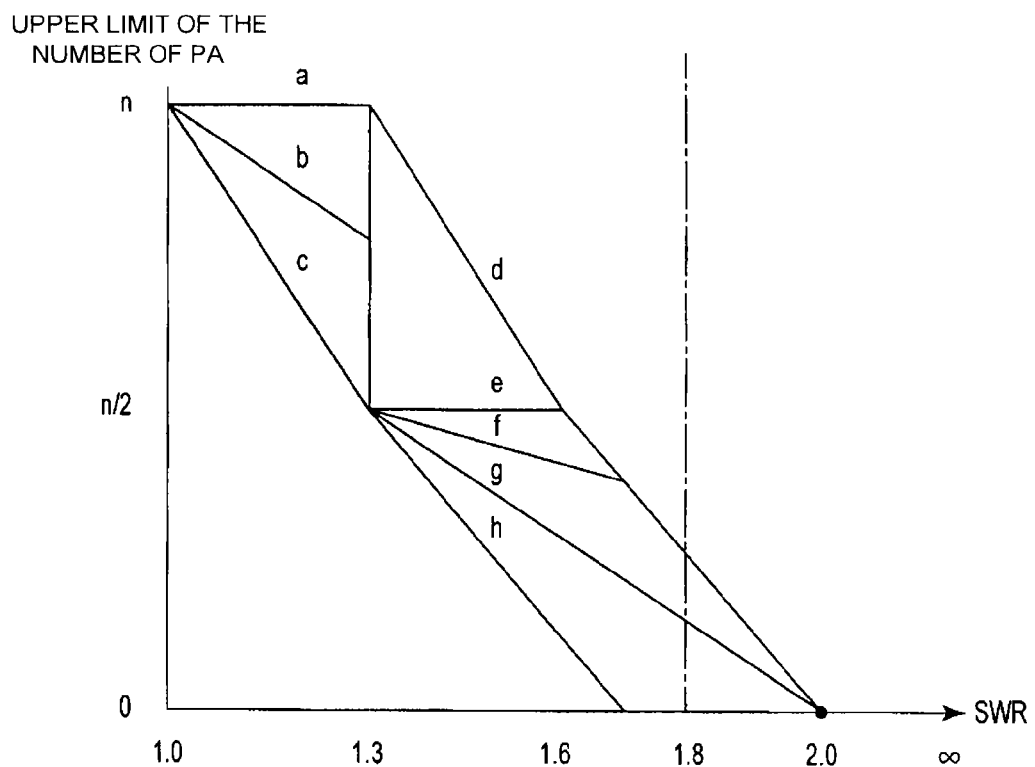
FIG. 7 is a diagram showing the relation between control areas of a fast surge protection section and a slow vector protection section in a fourth embodiment.

FIG. 7 shows the relation between a control area of the fast surge protection section 16 and a control area of the slow vector protection section 17. In FIG. 7, the threshold value=SWR 1.8 divides the fast surge protection area from the slow vector protection area.

The fast surge protection section 16 calculates the incident voltage Vf and the reflected voltage Vr of the AM signal based on the power amplifiers 121-128 which can be put into the ON state during normal operation. That is, the absolute value |Vf| of the incident voltage and the absolute value |Vr| of the reflected voltage are calculated, using the detection voltage v1 and the voltage v2 which is converted from the detection current i and is different in phase from the detection voltage v1 by $\pi/2$. |Vf|=|v1+v2|, and |Vr|=|v1−v2|. And when the absolute value |Vr| of the reflective voltage is larger than the certain threshold value, or the SWR (=(1+|Vr|/|Vf|)/(1−|Vr|/|Vf|)) that is the scalar value and is calculated using the SWR calculation circuit 163 is larger than the certain threshold value, the fast surge protection section 16 generates the output control signal indicating that the upper limit of the number of PAs is "2".

The slow vector protection section 17 performs digital processing of the detection current i and the detection voltage v1 detected by the measuring section 15, to obtain the reflection coefficient $\rho$ that is the vector value and is averaged in the time domain. The reflection coefficient $\rho$=Vr/Vf is calculated by the digital processing of the detection voltage v1 and the detection current i or the voltage v2 which is converted from the detection current i and is different in phase from the detection voltage v1 by $\pi/2$. The SWR obtained from the reflection coefficient $\rho$ is compared with the threshold value set in the fast surge protection section 16. When the SWR is not more than the threshold value, the slow vector protection section 17 determines the upper limit of the number of PAs based on the reflection coefficient $\rho$, and generates the output control signal including the upper limit of the number of PAs.

When the SWR that is the scalar value and is calculated by the fast surge protection section 16 is larger than the threshold value 1.8, the controller 11 makes the upper limit of the number of PAs 2. In addition, when the SWR obtained from the reflection coefficient that is the vector value and is calculated by the slow vector protection section 17 is larger than the threshold value 1.8, the controller 11 gives priority to the processing based on the output control signal of the fast surge protection section 16, and makes the upper limit of the number of PAs 2. Here, the controller 11 controls so that only the power amplifiers 121, 122 can be put into the ON state.

On the other hand, when the SWR obtained from the reflection coefficient that is the vector value and is calculated by the slow vector protection section 17 is not more than the threshold value 1.8, for example, when the SWR obtained from the reflection coefficient is 1.0-1.3, the controller 11 changes the upper limit of the number of PAs based on the phase relation between the incident voltage Vf and the reflected voltage Vr, that is, the reflection coefficient $\rho$.

As described above, even in the above-described fourth embodiment, the same operation and effect can be obtained as the first embodiment, and particularly when the apparatus controls so that only one or two power amplifiers can be put into the ON state, the apparatus can rapidly perform ON control.

According to one of the embodiments, it is possible to provide a digital amplitude modulation apparatus and a control method of a digital amplitude modulation apparatus which can perform protection operation of a power amplifier without narrowing a cover range of a broadcast service area and without deteriorating signal quality of an AM wave.

Other Embodiments

The invention is not limited to the above-mentioned embodiments as they are, and in a practical phase, a component can be changed and embodied within a range which does not deviate from the gist thereof. In addition, various inventions can be formed with proper combination of two or more components currently indicated by the above-mentioned embodiments. For example, some components may be deleted from all components indicated in the embodiments. Furthermore, a component covering the different embodiments may be combined properly.

What is claimed is:

1. A digital amplitude modulation apparatus which power-amplifies a transmission signal by a plurality of power amplifiers arranged in parallel, each of which is controlled to be ON/OFF in accordance with a voltage amplitude level of a signal to be modulated, combines outputs of the respective power amplifiers by a combiner, to generate an amplitude modulation signal as an RF (Radio Frequency) signal, and transmits an amplitude modulation wave to a prescribed broadcast service area, the digital amplitude modulation apparatus comprising:
    a measuring section which detects a voltage and a current from the amplitude modulation signal, and outputs a detection signal including a detection current and a detection voltage;
    a fast surge protection section which calculates an SWR (Standing Wave Ratio) using the detection signal outputted from the measuring section, compares the SWR with a predetermined threshold value, obtains a first upper limit of the number of the power amplifiers which can be put into an ON state and generates a first control signal including the first upper limit when the SWR is larger than the threshold value;
    a slow vector protection section which is connected in parallel with the fast surge protection section, calculates a reflection coefficient using the detection signal outputted from the measuring section, obtains an SWR from the reflection coefficient, compares the SWR obtained from the reflection coefficient with the threshold value, and obtains a second upper limit of the number of the power amplifiers which can be put into an ON state and generates a second control signal including the second upper limit when the SWR obtained from the reflection coefficient is not more than the threshold value; and
    a controller which controls the power amplifiers to be ON/OFF in accordance with the voltage amplitude level of the signal to be modulated within the first upper limit upon receiving the first control signal, and controls the power amplifiers to be ON/OFF in accordance with the voltage amplitude level of the signal to be modulated within the second upper limit upon receiving the second control signal.

2. The digital amplitude modulation apparatus as recited in claim 1, characterized in that: the fast surge protection section obtains the first upper limit based on the SWR; and the slow vector protection section obtains the second upper limit based on the reflection coefficient.

3. The digital amplitude modulation apparatus as recited in claim 1, characterized in that: when the SWR is larger than the threshold value, the fast surge protection section makes the first upper limit "0".

4. The digital amplitude modulation apparatus as recited in claim 1, characterized in that: the controller processes the first control signal in priority to the second control signal.

5. The digital amplitude modulation apparatus as recited in claim 1, characterized in that: the measuring section detects two signals which are same in amplitude and are different in phase by $\pi/2$.

6. The digital amplitude modulation apparatus as recited in claim 1, characterized in that: the fast surge protection section obtains the first upper limit based on a reflected voltage; and the slow vector protection section obtains the second upper limit based on the reflection coefficient.

7. The digital amplitude modulation apparatus as recited in claim 1, characterized in that: the reflection coefficient calculated by the slow vector protection section is a refection coefficient which is averaged in a time domain.

8. A control method of a digital amplitude modulation apparatus which power-amplifies a transmission signal by a plurality of power amplifiers arranged in parallel, each of which is controlled to be ON/OFF in accordance with a voltage amplitude level of a signal to be modulated, combines outputs of the respective power amplifiers by a combiner, to generate an amplitude modulation signal as an RF (Radio Frequency) signal, and transmits an amplitude modulation wave to a prescribed broadcast service area, the control method comprising:

detecting a voltage and a current from the amplitude modulation signal, to output a detection signal including a detection current and a detection voltage;

calculating an SWR (Standing Wave Ratio) using the detection signal, comparing the SWR with a predetermined threshold value, and obtaining a first upper limit of the number of the power amplifiers which can be put into an ON state based on the SWR and generating a first control signal including the first upper limit when the SWR is larger than the threshold value, by a fast surge protection section;

calculating a reflection coefficient using the detection signal, obtaining an SWR from the reflection coefficient, comparing the SWR obtained from the reflection coefficient with the threshold value, and obtaining a second upper limit of the number of the power amplifiers which can be put into an ON state based on the reflection coefficient and generating a second control signal including the second upper limit when the SWR obtained from the reflection coefficient is not more than the threshold value, by a slow vector protection section; and controlling the power amplifiers to be ON/OFF in accordance with the voltage amplitude level of the signal to be modulated within the first upper limit upon receiving the first control signal, and controlling the power amplifiers to be ON/OFF in accordance with the voltage amplitude level of the signal to be modulated within the second upper limit upon receiving the second control signal.

* * * * *